United States Patent [19]

Petrosky

[11] Patent Number: 4,573,177
[45] Date of Patent: Feb. 25, 1986

[54] BI-DIRECTIONAL CURRENT DIFFERENCER FOR COMPLEMENTARY CHARGE COUPLED DEVICE (CCD) OUTPUTS

[75] Inventor: Kenneth J. Petrosky, Glen Burnie, Md.

[73] Assignee: The United States of America as represented by the Secretary of the Air Force, Washington, D.C.

[21] Appl. No.: 577,392

[22] Filed: Feb. 6, 1984

[51] Int. Cl.[4] .................. H03K 23/46; H03K 3/86
[52] U.S. Cl. .......................... 377/60; 377/63; 377/49; 307/296 R; 307/529; 330/257; 330/288; 357/24
[58] Field of Search ............... 377/60, 63, 49; 307/530, 297, 296 R, 529; 330/288, 257; 357/24 M

[56] References Cited

U.S. PATENT DOCUMENTS

| | | | |
|---|---|---|---|
| 3,819,953 | 6/1974 | Puckette et al. | 307/246 |
| 4,055,812 | 10/1977 | Rosenthal | 330/253 |
| 4,093,963 | 6/1978 | Uchida | 307/514 |
| 4,104,543 | 8/1978 | Maeding | 377/57 |
| 4,239,983 | 12/1980 | Edwards et al. | 377/49 |
| 4,264,873 | 4/1981 | Kominami et al. | 330/257 |
| 4,348,602 | 9/1982 | Sauer | 307/530 |
| 4,366,445 | 12/1982 | Cave et al. | 330/257 |
| 4,445,054 | 4/1984 | Ishii | 330/288 |

FOREIGN PATENT DOCUMENTS 100713 7/1980 Japan .................. 330/288

Primary Examiner—John S. Heyman
Assistant Examiner—Karl Ohralik
Attorney, Agent, or Firm—Donald J. Singer; Willard A. Matthews

[57] ABSTRACT

D.C. reconstruction of sampled CCD output signals is achieved by subtracting the output current pulses of two CCDs (or subtracting parallel outputs of the same CCD) with a differencing circuit containing two biasing current mirrors, a current sink device and an output capacitor. The two current mirrors are used with each biasing the output of a complementary CCD to positive and acting to mirror the CCD output current. A third current mirror converts the output of one of the CCDs into a current sink. An output capacitor performs subtracting by converting all outputs to voltage and combining the positive biased output of one CCD with the current said output of the second CCD.

13 Claims, 4 Drawing Figures

BI-DIRECTIONAL CURRENT DIFFERENCER FOR COMPLEMENTARY CHARGE COUPLED DEVICE (CCD) OUTPUTS

STATEMENT OF GOVERNMENT INTEREST

The invention described herein may be manufactured and used by or for the Government for governmental purposes without the payment of any royalty thereon.

BACKGROUND OF THE INVENTION

The present invention relates to circuits for processing the output of Charge Coupled Devices (CCD's) and specifically to a means for subtracting the output current pulses of 2 CCDs or 2 parallel outputs of the same CCD for d.c. reconstruction of the sampled signal.

A charge coupled device (CCD) transfers data in the form of charge packets from input at some rate controlled by clocking waveforms applied to the CCD electrodes. At the output, each charge packet manifests itself as a current pulse, which is normally converted to an output voltage to a circuit. In this circuit the output voltage is proportional to $Q_n/C_p$ (charge divided by output capacitance), and this voltage is reset to some reference $V_R$ after each cycle.

A CCD allows only unipolar signals (charge) to be applied and propagated through it, so any bipolar signals must be offset by some "fat zero" to make it unipolar. For many signal processing applications, it is desirable to reconstruct a true DC signal from the shifted output. Dark current generation which is a function of temperature, clock rate, and number of stages prevents one from simply subtracting out a known DC constant. Techniques which have been used to overcome this problem include the operation of 2 parallel CCDs, one with (REF+SIGNAL) and the other with (REF-SIGNAL), and subtracting the two voltage outputs.

Techniques for obtaining a representation of the difference between charge quantities are known in the prior art and normally require the charge quantities to be converted to corresponding voltage so that subtraction can be performed. One class of prior art circuits includes two capacitors wherein the two quantities of charge are stored in separate capacitors and are thereby converted into two corresponding voltages, one of which is then subtracted from the other.

Two capacitor circuits exhibit the undesirable feature that the two capacitors may have inherently different characteristics which effect the charge stored thereon, and when the two resultant voltages are subtracted the effect of the characteristic differences is included in the difference voltage as a distortion and poses a limit on the accuracy of the circuit.

Another prior art technique which is distinct from the two-capacitor device approach is the device described below. This device consists of two transistors and performs current subtraction such that $I_0=I_1-I_2$. However, the device is unsatisfactory for CCD output signal comparisons since it is bound by the constraint that $I_1$ always be greater than $I_2$ since the resultant $I_0$ can only flow in one direction.

U.S. Pat. No. 4,104,543 entitled "Multichannel CCD Signal Subtraction System" issued Aug. 1, 1978 to Maeding et al describes a multichannel CCD structure which likewise produces a voltage representative of the desired accummulated differences of the charges contained in the multichannel structure.

The Maeting patent discloses a multichannel CCD signal subtraction system wherein charges from 2 CCDs are subtracted by circuitry including a clamp floating sensing electrode. An output voltage is produced which is proportional to the current difference.

The subject invention is distinct from the prior art in that the difference between input currents is represented by converting the processed signals to an output voltage by a single capacitor. The disclosure in the Maeting patent does not have the output conversion. The two capacitor subtraction technique has an inherent potential problem that is avoided in the subject invention.

Since both charge quantities are sequentially placed on the same capacitor to produce the two representative voltages, there is no tracking error which might arise if the charge quantities were placed on two separate capacitors.

U.S. Pat. No. 4,055,812 entitled "Current Subtractor" issued on Oct. 25, 1977 to Rosenthal discloses a current subtractor circuit which utilizes a single current mirror amplifier as the subtracting element. However, a single current mirror is an unacceptable means of subtracting the current pulses of 2 CCDs for d.c. reconstruction of the sampled signal. Since a CCD allows only unipolar signals to be applied to it, a single current mirror is bound by the constraint that $I_1$ always be greater than $I_2$ in performing the substraction function $I_0=I_1-I_2$ with the result being a d.c. reconstruction of the sampled signal.

U.S. Pat. No. 4,348,602 entitled: Current Comparator Circuit With Deadband" issued on Sept. 7, 1982 to Sauer discloses a current comparator circuit which provides an output corresponding to the difference of the inputs to a current mirror.

However, since it uses only a single current mirror, it is unacceptable for d.c. reconstruction of the sampled signal of 2 CCDs for the same reasons that the Rosenthal patent is inadequate.

Another prior art technique is disclosed in U.S. Pat. No. 4,264,873 entitled "Differential Amplification Circuit" issued on Apr. 18, 1981 to Kominanmi et al. The Kominanmi et al patent discloses a differential amplifier circuit which uses a current mirror to generate an output difference current.

However, the use of a current mirror is inadequate for CCD signal comparison for the reasons cited above.

In view of the foregoing discussion, it is apparent that there exists a need for a current subtraction system that is tailored to accept the clockwave outputs of charge coupled devices, and that such a system should not be bound by the constraint that one specified CCD output must always be greater than the other specified outputs to perform successful current subtraction. The present invention is directed toward satisfying that need.

SUMMARY OF THE INVENTION

This invention provides a means of subtracting the output current pulses of 2 CCDs, or 2 parallel outputs of the same CCD, for d.c. reconstruction of the sampled signal.

In order to subtract the output current pulses of 2 CCDs or two parallel outputs of the same CCD, two current mirrors are used, each biasing the output of a complementary CCD to positive and acting to mirror the CCD output current. Next, a third current mirror converts the output of one of the CCDs into a current sink. Finally, an outputs capacitor performs subtraction by converting all output to voltage and combining the positive biased output of one CCD with the current sink output of the second CCD. The resulting output is a sampled voltage looking very much like a standard CCD output.

It is a principal object of the invention to provide a new and improved method and means of current subtraction, or obtaining an output signal proportional to the difference between two quantities of charge of the same polarity.

It is another object of the invention to provide the means of performing this subtraction without the constraint that one specified input to the subtraction circuit must always be greater than the second specified input.

These, together with other objects, features and advantages of the invention, will become more readily apparent from the following detailed description when taken in conjunction with the accompanying drawing wherein like elements are given like reference numerals throughout.

DETAILED DESCRIPTION OF THE PREFERRED EMBODIMENT

This invention provides a means of subtracting the output current pulses of 2 CCDs or 2 parallel outputs of the same CCD for d.c. reconstruction of the sampled signal.

Figure 1:
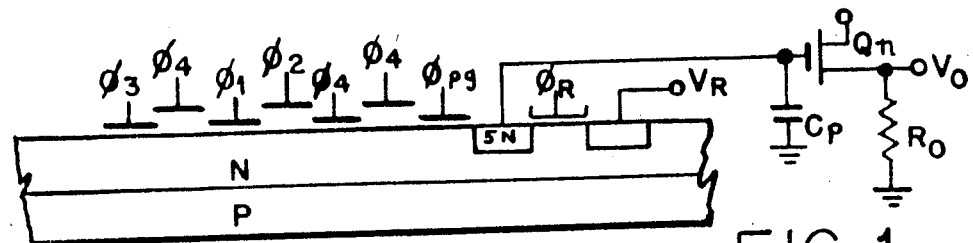
FIG. 1 is a sketch schematically illustrating the output portion of a typical CCD together with a prior art circuit for combining signals generated thereby into an output voltage.

In order to subtract the output current pulses of 2 CCDs or two parallel outputs of the same CCD, two current mirrors are used, each biasing the output of a complementary CCD to positive and acting to mirror the CCD output current. Next, a third current mirror converts the output of one of the CCDs into a current sink. Finally, an output capacitor performs subtraction by converting all outputs to voltages and combining the positive biased output of one CCD with the current sink output of the second CCD. The resulting output is a sampled voltage looking very much like the output of the standard CCD of FIG. 1. FIG. 1 is a sketch illustrating the output portion of a typical CCD and the circuit which is normally used to convert signals generated by the CCD into an output voltage. A charge coupled device (CCD) transfers data in the form of charge packets from input at some rate controlled by clocking waveforms applied to the CCD electrodes. At the output, each charge packet manifests itself as a current pulse. The CCD output is a clocked current pulse. The current pulse enters the circuit through a current well 5N which is reset to some reference voltage $V_R$ after each cycle. The CCD output is next converted to a voltage by entering capacitor Co and the gate electrode of transistor Qn. In this circuit the output voltage $V_o$ is proportional to Qn/Cp (charge divided by output capacitance), and this voltage is reset to some reference $V_R$ after each cycle. The output voltage is taken off resistor Ro which is connected to the source electrode of transistor $Q_n$.

Figure 2:
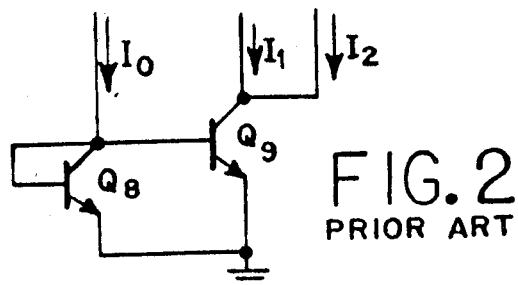
FIG. 2 is a sketch illustrating a current subtraction circuit.

FIG. 2 is a sketch illustrating a prior art current differencing circuit consisting of two transistors $Q_8$ and $Q_9$ having interconnected base electrodes and commonly grounded emitter electrodes. Two input currents $I_1$ and $I_2$ enter the circuit in the collector electrode of transistor $Q_9$. One current output $I_o$ appears on the emitter electrode of transistor $Q_8$, which is interconnected with the commonly coupled base electrodes. While the current differencing circuit of FIG. 2 produces the current differencing function of $I_o - I_1 = I_2$, this prior art circuit is bound by the constraint that $I_o > I_1$ since the current $I_2$ can only flow in one direction.

A CCD allows only unipolar signals (charge) to be applied and propogated through it. The bi-directional current differencer was developed to eliminate constraints of subtracting the output current pulses of two CCDs or two parallel outputs of the same CCD.

Figure 3:
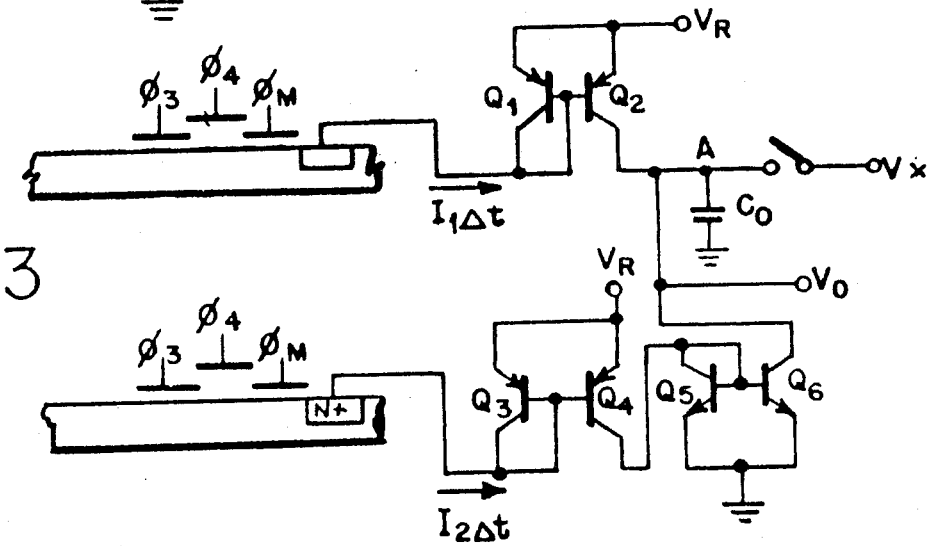
FIG. 3 is an illustration of one presently preferred embodiment of the subject invention; and, FIG. 4 is an illustration of another embodiment of the invention.

The simplest embodiment used to explain the operation of the subject invention is shown in FIG. 3. Two separate current pulses are input into the circuit of the invention through PNP transistors $Q_1$ and $Q_3$. These two current pulses are meant to represent either the output current pulses of two CCDs, or two parallel outputs of the same CCD which are sent at some rate controlled by a clocking waveform.

The two separate current pulses which are input into transistors $Q_1$, $Q_3$ are labeled $I_1\Delta t$ and $I_2\Delta t$. Each of these current pulses are processed by a current mirror: $I_1\Delta t$ is processed by the current mirror formed by PNP transistors $Q_1$ and $Q_2$, and $I_2\Delta t$ is processed by the current mirror formed by PNP transistors $Q_3$ and $Q_4$. $I_1\Delta t$ is input through the collector electrode of $Q_1$ and the base electrodes of both $Q_3$ and $Q_4$. $I_2\Delta t$ is biased to positive by a reference voltage $V_R$, which is input through the emitter electrode of both $Q_1$ and $Q_2$. The base electrodes of $Q_1$ and $Q_2$ are coupled together and the emitter electrodes of $Q_1$ and $Q_2$ are coupled together. After $I_1\Delta t$ is biased to positive, it is mirrored as the current pulse output of the collector electrode of transistor $Q_2$.

$I_2\Delta t$ is input through the collector electrode of $Q_3$ and the base electrodes of both $Q_3$ and $Q_4$. $I_2\Delta t$ is biased to positive by a reference voltage $V_R$, which is input through the emitter electrodes of both $Q_3$ and $Q_4$. The base electrodes of $Q_3$ and $Q_4$ are coupled together and the emitter electrodes of $Q_3$ and $Q_4$ are coupled together. After $I_2\Delta t$ is biased to positive, it is mirrored as the current pulse output of the collector electrode of transistor $Q_4$. $I_2\Delta t$ is next processed by a third voltage mirror formed by PNP transistors $Q_5$ and $Q_6$, which transform the current into a current sink. $I_2\Delta t$ enters the third current mirror through the collector electrode of $Q_5$, and the base collectors of $Q_5$ and $Q_6$ which are coupled together. $I_2\Delta t$ is converted into a current sink by applying a ground to the emitter electrodes of $Q_5$ and $Q_6$, which are coupled together. The current sink signal is sent out through the collector electrode of $Q_6$ for subtraction.

Subtraction of the currents is performed by means of a single output capacitor $C_o$. The capacitor converts the current values to voltages and the resultant subtraction is performed as described below. Before the charges are collected by $C_o$, a reset switch sets node A to voltage $V_x$, where $V_x$ is a value halfway between $V_R$ and ground. The potential $V_x$ and the potential $V_R$ may be applied by circuitry known in the art. When a signal charge is collected in the output diffusion portion of the CCD, current spike outputs are mirrored to the output node A yielding a voltage given by:

$$V_{out} = V_x + \frac{K_1 I_{1\Delta} t - K_2 I_{2\Delta} t}{C_o}$$

where:
$I_1, \Delta t$ = signal charge from CCD output 1
$I_2, \Delta t$ = signal charge from output 2
$k_1, k_2$ = efficiency factors of current mirrors approaches unity as transistor Beta gets larger
The output current $$I_o = C_o \frac{d}{dt} V_{out}.$$

Thus the output current equals $K_1 I_1 - K_2 I_2$ which approaches $I_1 - I_2$ as $K_1 K_2$ aproach unity. Since the betas of PNP transistor manufactured by present-day monolithic integrated circuit processes are relatively high, the values of $K_1$ and $K_2$ do approach unity and the value of $I_o$ equals $I_1 - I_2$.

Figure 4:
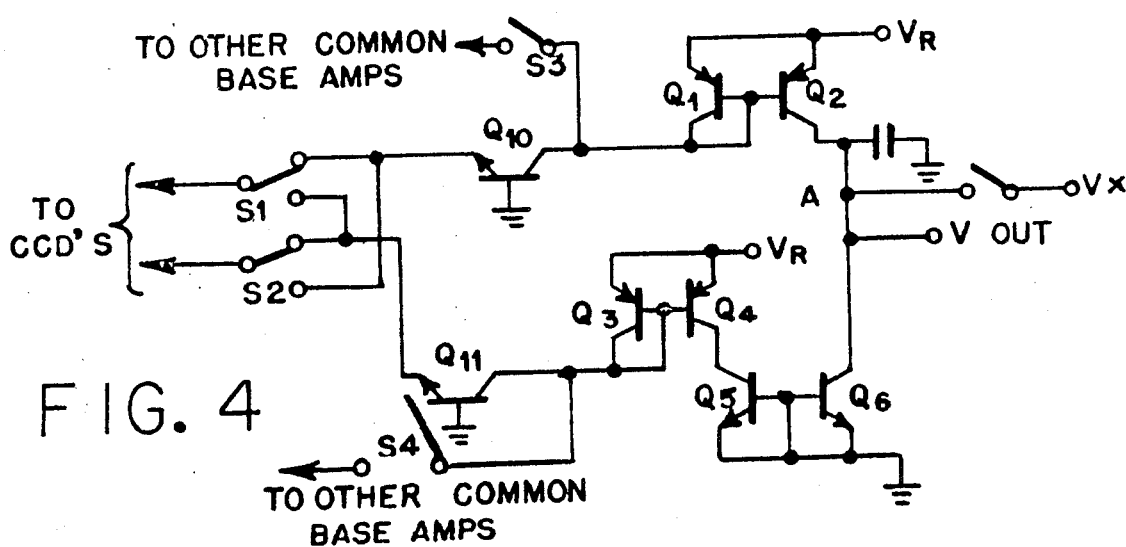

FIG. 4 represents another embodiment of the subject invention. Since like elements are given like reference numerals throughout the accompanying drawings, the common elements between FIGS. 4 and 3 function as described above.

What the embodiment in FIG. 4 entails is the invention discussed in the description of FIG. 3 with the addition of CCD output switching, and common base amplifiers.

The CCD output switching is illustrated by switches $S_1$ and $S_2$, and access to other common base amplifiers is allowed by switches $S_4$ and $S_5$. The two transistors $Q_{10}$ and $Q_{11}$ are an example of one such common base amplifier circuit for this embodiment since its two outputs being differenced in this case were from adjacent destructive taps on the same CCD. Signals were applied to this CCD by alternating a sample and its complement. The switching provides the +/- multiply function required in this application, and the common base amplifiers allow summing of many CCDs before current differencing is applied. It is also recognized that PMOS transistors could be used instead of the PNPs in this circuit for process compatibility if the current differencer were to be integrated on the CCD chip. The speed of operation would have to be considered for the particular application in this case.

While the invention has been described in its presently preferred embodiment, it is understood that the words which have been used are words of description rather than words of limitation and that changes within the purview of the appended claims may be made without departing from the scope and spirit of the invention in its broader aspects.

What is claimed is:

1. A bi-directional current differencer for subtracting complementary charge coupled device (CCD) outputs of a first charge coupled device which produces a first output current from a second output current produced by a second charge coupled device, said bi-directional current differencer comprising:
   first and second current mirrors, each being forward biased and each respectively biasing a discrete output of said first and second charge coupled devices to positive and acting to mirror the first and second charge couple device output currents by collector current matching while under a forward bias, said first current mirror thereby producing a first mirrored output current, said second current mirror thereby producing a second mirrored output current;
   a circuit polarity reversing means, said reversing means producing an output by converting the outputs of said first current mirror into a current sink, and
   a subtracting means, said subtracting means combining the current sink output with the positive-biased output of said second current mirror.

2. A bi-directional current differencer as defined in claim 1, including a voltage source which produces a biasing voltage $V_R$ and a supply voltage $V_x$ which is set at a level halfway between the biasing voltage and ground, and wherein said first current mirror comprises:
   first and second PNP transistors, having commonly connected emitter terminals electrically connected to said voltage source and receiving said biasing voltage $V_R$, said first and second PNP transistors thereby becoming forward biased, said first and second PNP transistors having commonly connected base terminals which are electrically connected to said first charge coupled device, said first PNP transistor having its collector terminal connected to its base terminal and receiving thereon said first output current from said first charge coupled device; and
   said second PNP transistor outputting said first mirrored output current over its collector terminal by collector current matching with said first PNP transistor, said first and second transistors thereby biasing the first output current from the first charge coupled device to positive.

3. A bi-directional current differencer as defined in claim 2, wherein each said second current mirror comprises:
   a third and fourth PNP transistor, the base electrodes thereof being interconnected, the emitter electrodes thereof being interconnected, the emitter electrodes thereof being interconnected, and connected to said voltage supply and receiving said biasing voltage $V_R$ said third and fourth PNP transistors thereby becoming forward biased, said third transistor having its collector electrode connected to its base electrode and to the second charge coupled device, receiving therefrom the second mirrored output signal; and
   said fourth PNP transistor outputting said second mirrored output current over its collector terminal by collector current matching with said third PNP transistor, said third and fourth transistor thereby biasing the second output current from the second charge coupled device to positive.

4. A bi-directional current differencer as defined in claim 3 wherein said reversing means comprises:
   first and second NPN transistors, the base electrodes thereof being interconnected, the emitter electrodes thereof being interconnected, said first NPN transistor having its collector electrode connected to its base electrode and to the output of said first current mirror, said first NPN transistor having its emitter electrode connected to a ground, converting the output of said first current mirror into a current sink, and said second NPN transistor having its collector electrode connected to said subtracting means, mirroring the current pulse output of said first current mirror in reverse polarity.

5. A bi-directional current differencer as defined in claim 4 wherein said subtracting means comprises:
an output capacitor, said capacitor being electrically interconnected with and receiving the outputs of: said reversing means and, said second current mirror, said capacitor converting all currents it receives to voltages and performing the resultant subtraction.

6. A bi-directional current differencer as defined in claim 5 including a summing means, said summing means summing multiple CCD current pulse outputs, and said bi-directional current differences applying current differencing to the current pulse outputs of said summing means.

7. A bi-directional current differencer as defined in claim 6 wherein said summing means comprises:
first and second switching means, said first switching means conducting the current pulse output of multiple CCDs,
common base amplifier circuits receiving the current pulse outputs from the first switching means and summing the current pulse outputs, and
said second switching means accessing the output of said common base amplifier circuits to said bi-directional current differencer.

8. In combination with a voltage source producing a biasing voltage $V_R$ and a supply voltage $V_x$, said supply voltage having a value of approximately one half of the biasing voltage, and in combination with first and second charge coupled devices which respectively produce first and second output currents, a bi-directional current differencer for subtracting the first output current from the second output current, said bi-directional current differencer comprising:
a first and second current mirror, each electrically connected to the voltage source and receiving the biasing voltage to become forward biased, said first current mirror receiving the first output current from the first charge coupled device over a first collector electrode and producing a first mirrored output current over a second collector electrode by collector current matching while under the forward bias, said first current mirror thereby biasing the first output current of the first charge coupled device to positive;
said second current mirror receiving the second output current from the second charge coupled device over a third collector electrode and producing a second mirrored output current over its fourth collector electrode by collector current matching while under the forward bias, said second current mirror thereby biasing the second output current of the second charge coupled device to positive;
a third current mirror which is electrically connected to a common electrical ground by its commonly connected emitter electrodes, said third current mirror receiving said first mirrored output current from said first current mirror over a fifth collector terminal and produces a current sink of said first mirrored output current out a sixth collection terminal by collector current matching;
a reset switch which is biased open and electrically connected to the voltage source and receives the supply voltage $V_x$ therefrom;
an output capacitor which is electrically connected on one terminal to the reset switch, and the second and third current mirrors, said output capacitor being electrically connected on its other terminal to the common electrical ground, said output capacitor receiving said second mirror output current from said second current mirror and the current sink from the third current mirror, said output capacitor performing the subtraction by converting all received currents into their voltages and combining them when said reset switch is open.

9. A bi-directional current differencer, as defined in claim 8, wherein said first current mirror comprises:
first and second PNP transistors having commonly connected emitter terminals electrically connected to said voltage source and receiving said biasing voltage $V_R$, said first and second PNP transistors thereby becoming forward biased, said first and second PNP transistors having commonly connected base terminals which are electrically connected to said first charge coupled device, said first PNP transistor having its collector terminal connected to its base terminal and receiving said first output current from said first charge coupled device; and
said second PNP transistor outputting said first mirrored output current over its collector terminal.

10. A bi-directional current differencer, as defined in claim 9, wherein said second current mirror comprises:
third and fourth PNP transistors having commonly connected emitter terminals electrically connected to said voltage source and receiving said biasing voltage $V_R$, said third and fourth PNP transistors thereby becoming forward biased, said third and fourth PNP transistors having commonly connected base terminals which are electrically connected to the second charge coupled device, the third PNP transistor having its collector terminal to its base terminal and receiving said second output current from said second charge coupled device; and
said fourth PNP transistor outputting said second mirrored output current over its collector terminal by collector current matching with said third PNP transistor.

11. A bi-directional current differencer, as defined in claim 10, wherein said third current mirror comprises:
first and second NPN transistors having commonly connected emitter terminals connected with commonly connected base terminals which are, in turn, connected to the common electrical ground, said first NPN transistor receiving the first mirrored output current from the first current mirror over its collector terminal;
said second NPN transistor outputting said current sink out its collector terminal by collector current matching in conjunction with said first NPN transistor.

12. A bi-directional current differencer, as defined in claim 11 including a summing means, said summing means producing current pulse outputs by summing multiple charge coupled device current pulse outputs, and said bi-directional current differencer applying current differencing to the current pulse outputs of said summing means.

13. A bi-directional current differencer, as defined in claim 12 wherein said summing means comprises:

first and second switching means, said first switching means conducting the current pulse output of multiple charge coupled devices;

common base amplifier circuits electrically connected to the first and second switching means and summing the current pulse outputs; and said second switching means conducting the output of said common base amplifier circuits to said bi-directional current differencer.

* * * * *